US007744385B2

(12) United States Patent
Scherer

(10) Patent No.: US 7,744,385 B2
(45) Date of Patent: Jun. 29, 2010

(54) HIGH SPEED CABLE TERMINATION ELECTRICAL CONNECTOR ASSEMBLY

(75) Inventor: Richard J. Scherer, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 12/247,146

(22) Filed: Oct. 7, 2008

(65) Prior Publication Data

US 2009/0104800 A1 Apr. 23, 2009

Related U.S. Application Data

(60) Provisional application No. 60/981,379, filed on Oct. 19, 2007.

(51) Int. Cl.
*H01L 21/44* (2006.01)

(52) U.S. Cl. .................. 439/101; 439/607.05; 439/701

(58) Field of Classification Search ................ 439/101, 439/701, 607.05
See application file for complete search history.

(56) References Cited

U.S. PATENT DOCUMENTS

| | | | | |
|---|---|---|---|---|
| 4,586,776 | A | 5/1986 | Ollis et al. | |
| 4,772,210 | A | 9/1988 | Venaleck | |
| 4,897,046 | A | 1/1990 | Tengler et al. | |
| 4,941,831 | A | 7/1990 | Tengler et al. | |
| 4,964,814 | A | 10/1990 | Tengler et al. | |
| 5,184,965 | A * | 2/1993 | Myschik et al. | 439/578 |
| 5,197,893 | A * | 3/1993 | Morlion et al. | 439/101 |
| 5,421,735 | A * | 6/1995 | Dechelette | 439/101 |
| 6,146,202 | A | 11/2000 | Ramey et al. | |
| 6,231,391 | B1 | 5/2001 | Ramey et al. | |
| 6,316,954 | B1 | 11/2001 | Venalek et al. | |
| 6,368,120 | B1 | 4/2002 | Scherer et al. | |
| 6,371,813 | B2 | 4/2002 | Ramey et al. | |
| 6,524,135 | B1 | 2/2003 | Feldman et al. | |
| 6,780,069 | B2 | 8/2004 | Scherer et al. | |
| 7,004,793 | B2 | 2/2006 | Scherer et al. | |
| 7,445,471 | B1 * | 11/2008 | Scherer et al. | 439/108 |
| 7,553,187 | B2 * | 6/2009 | Feldman et al. | 439/108 |
| 2005/0048846 | A1 | 3/2005 | Suzuki et al. | |
| 2005/0118883 | A1 * | 6/2005 | Kim | 439/701 |
| 2007/0141871 | A1 | 6/2007 | Scherer et al. | |

* cited by examiner

*Primary Examiner*—Hae Moon Hyeon
(74) *Attorney, Agent, or Firm*—Melanie G. Gover; Dean M. Harts

(57) ABSTRACT

An electrical connector assembly comprises a header and a plurality of electrical cable terminations. Each of the cable terminations includes an electrically conductive housing, at least one signal contact positioned within an interior of the housing and electrically insulated from the housing, and at least two ground contacts extending from an exterior of the housing. The cable terminations are configured to mate with the header such that, for each cable termination, the signal contacts engage corresponding ones of the plurality of signal pins, and the ground contacts engage corresponding ones of the plurality of ground pins when the header and cable terminations are in a mated configuration.

20 Claims, 7 Drawing Sheets

G S S G S S G
G S S G S S G
G S S G S S G
G S S G S S G

*Fig. 5A*

G S G S G S G
G S G S G S G
G S G S G S G
G S G S G S G

*Fig. 5B*

G S G S G S G
S G S G S G S
G S G S G S G
S G S G S G S

*Fig. 5C*

HIGH SPEED CABLE TERMINATION ELECTRICAL CONNECTOR ASSEMBLY

CROSS REFERENCE TO RELATED APPLICATION

This application claims the benefit of U.S. Provisional Patent Application No. 60/981,379, filed Oct. 19, 2007, the disclosure of which is incorporated by reference herein in its entirety.

BACKGROUND

The present invention relates generally to interconnections made between a printed circuit board and one or more electrical cables carrying signals to and from the circuit board.

The interconnection of printed circuit boards to other circuit boards, cables, or other electronic devices is well known in the art. Such interconnections typically have not been difficult to form, especially when the circuit switching speeds (also referred to as signal transition times) have been slow when compared to the length of time required for a signal to propagate through a conductor in the interconnect or on the printed circuit board. However, as circuit switching speeds continue to increase with modern integrated circuits and related computer technology, the design and fabrication of satisfactory interconnects has grown more difficult.

Specifically, there is a continued and growing need to design and fabricate printed circuit boards and their accompanying interconnects with closely controlled electrical characteristics to achieve satisfactory control over the integrity of the signal as it travels through the interconnect to and from the printed circuit board. The extent to which electrical characteristics (such as impedance) of the interconnect must be controlled depends heavily upon the switching speed of the circuit. That is, the faster the circuit switching speed, the greater the importance of providing an accurately controlled impedance within the interconnect.

SUMMARY

In one aspect, the instant disclosure provides an electrical connector assembly for transmitting electrical signals. In one embodiment, the assembly comprises a header having a plurality of signal pins and a plurality of ground pins, and a plurality of electrical cable terminations. Each of the plurality of cable terminations includes an electrically conductive housing, at least one signal contact positioned within an interior of the housing and electrically insulated from the housing, and at least two ground contacts, where each of the ground contacts extend from an exterior of the housing. The cable terminations are configured to mate with the header such that, for each cable termination, the signal contacts engage corresponding ones of the plurality of signal pins, and the ground contacts engage corresponding ones of the plurality of ground pins when the header and cable terminations are in a mated configuration.

In another embodiment, the assembly comprises a printed circuit board having a plurality of signal traces and at least one ground trace, a header body mounted on the printed circuit board, a carrier body configured to mate with the header body, and a plurality of electrical cable terminations retained within the carrier body. The header body supports a plurality of signal pins and a plurality of ground pins, where the plurality of signal pins are electrically connected to the plurality of signal traces and wherein the plurality of ground pins are electrically connected to the at least one ground trace on the printed circuit board. Each of the plurality of cable terminations includes a pair of signal contacts positioned within an interior of an electrically conductive housing and at least two ground contacts, where at least one of the ground contacts extends from an exterior of the housing. The header and cable terminations are configured such that each of the plurality of cable terminations makes electrical contact with a pair of the signal pins and a pair of the ground pins when the header and carrier are in a mated configuration, with the pair of signal pins positioned between the pair of ground pins.

In another embodiment, the assembly comprises a plurality of electrical cable terminations and a carrier. Each of the plurality of cable terminations includes an electrically conductive housing, at least one signal contact positioned within an interior of the housing and electrically insulated from the housing, and at least two ground contacts extending from an exterior of the housing, wherein the at least one signal contact and at least two ground contacts are linearly aligned. The carrier is configured to retain the plurality of cable terminations therein such that when engaged with the header, for each cable termination, the signal contacts engage corresponding ones of the plurality of signal pins, and the ground contacts engage corresponding ones of the plurality of ground pins.

In another embodiment, the assembly comprises a header having a plurality of rows of male contacts, each of the male contacts comprising one of a signal pin, a ground pin, and a power pin; and a plurality of electrical cable terminations. Each of the plurality of cable terminations comprises an electrically conductive housing, at least one internal contact positioned within an interior of the housing and electrically insulated from the housing, the internal contact comprising one of a signal contact, a ground contact, and a power contact, and at least two external contacts extending from an exterior of the housing, each of the external contacts comprising one of a ground contact and a power contact. The at least one internal contact and at least two external contacts are linearly aligned.

In another embodiment, the assembly comprises a plurality of electrical cable terminations and a carrier. Each of the plurality of cable terminations comprises an electrically conductive housing, at least one internal contact positioned within an interior of the housing and electrically insulated from the housing, the internal contact comprising one of a signal contact, a ground contact, and a power contact, and at least two external contacts extending from an exterior of the housing, each of the external contacts comprising one of a ground contact and a power contact, wherein the at least one internal contact and at least two external contacts are linearly aligned. The carrier is configured to retain at least a portion of the plurality of cable terminations therein such that when engaged with the header, for each cable termination, the at least one internal contact and the ground contacts engage corresponding ones of the plurality of male contacts.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIGS. 5A-5C illustrate representative arrays of signal and ground contacts.

DETAILED DESCRIPTION

In the following detailed description, reference is made to the accompanying drawings, which form a part hereof, and in which is shown by way of illustration specific embodiments in which the invention may be practiced. The illustrated embodiments are not intended to be exhaustive of all embodiments according to the invention. It is to be understood that other embodiments may be utilized and structural or logical changes may be made without departing from the scope of the present invention. The following description, therefore, is not to be taken in a limiting sense, and the scope of the present invention is defined by the appended claims.

Figure 1A:
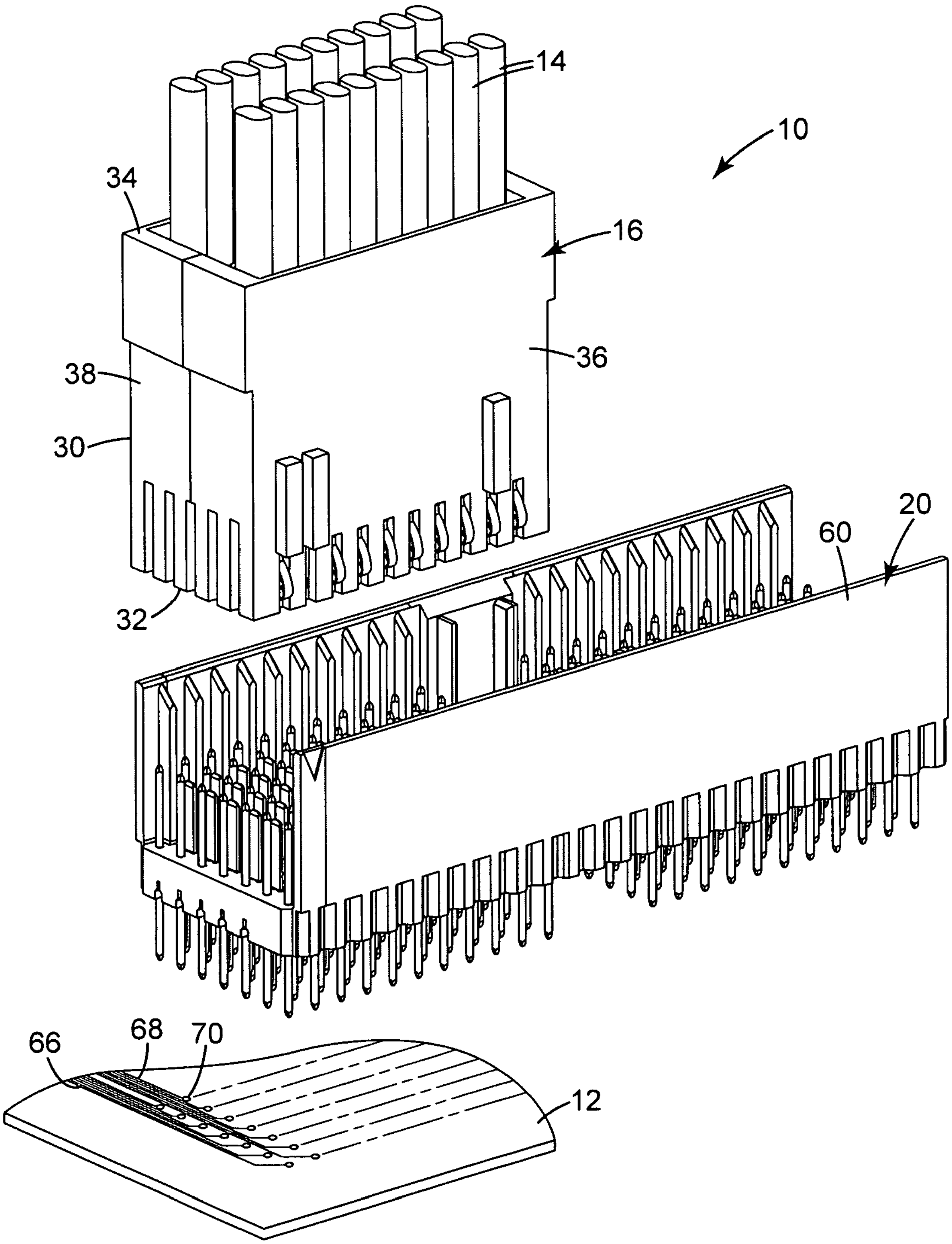
FIG. 1A is a perspective illustration of a connector assembly according to one embodiment, with a carrier holding a plurality of cable terminations poised for engagement with a header.
Figure 1B:
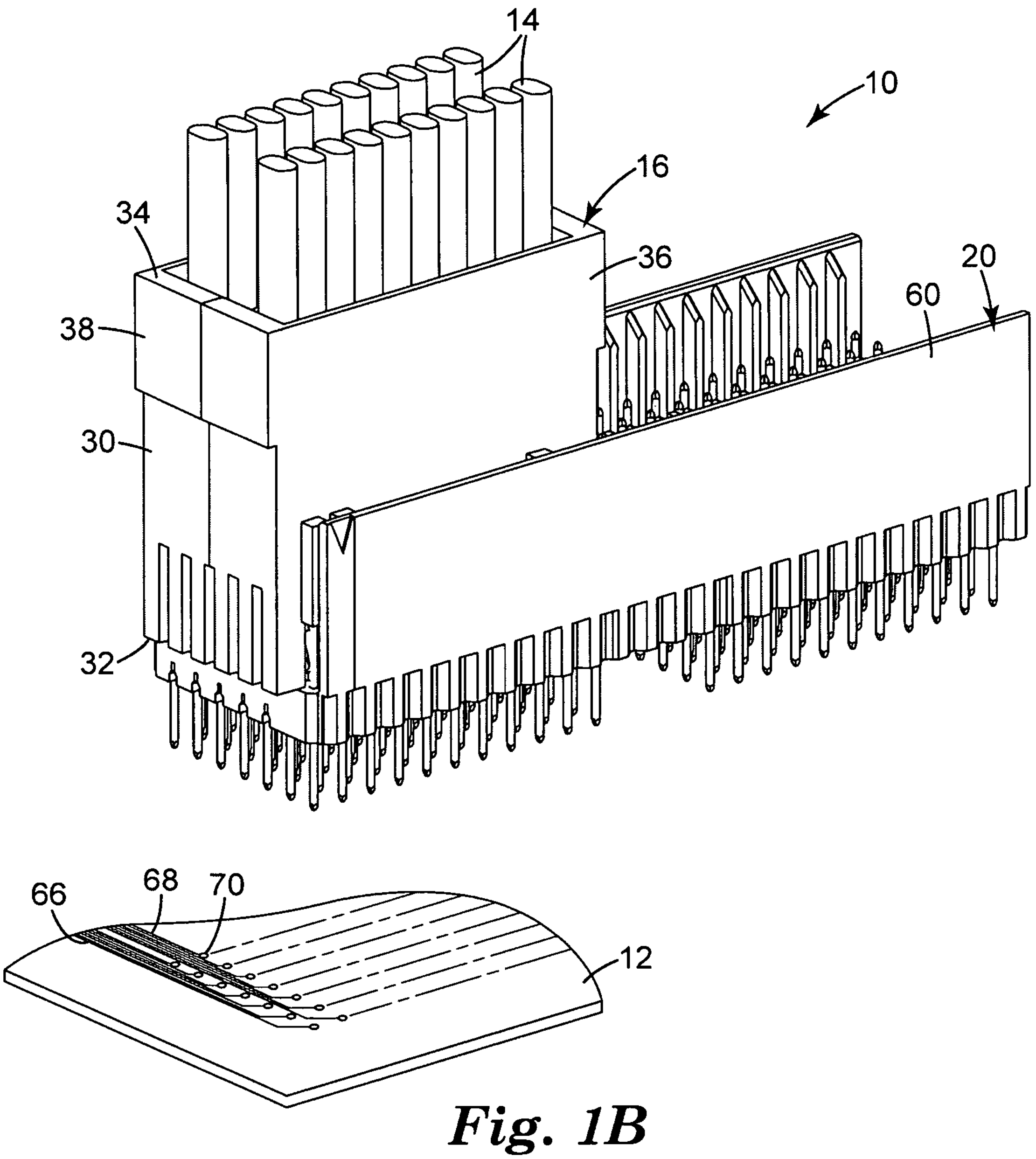
FIG. 1B is a perspective illustration of the connector assembly of FIG. 1A, with the carrier holding the cable terminations engaged with the header.

Referring to FIGS. 1A and 1B, a connector assembly 10 according to one embodiment is illustrated providing an interconnection between a printed circuit board 12 and a plurality of cables 14. The connector assembly 10 includes a carrier 16 retaining cable terminations 18 (FIGS. 2A and 2B) of the individual cables 14, and a header 20 configured for mounting on the printed circuit board 12. The carrier 16 is configured to mate with the header 20 and thereby form an electrical connection between the cables 14 and the printed circuit board 12.

For purposes of clarity, the invention is described and illustrated herein as used with a single type of cable 14. However, such illustration is exemplary only, and it is understood and intended that the present invention is equally suitable for use with other types of cables 14 having signal and ground elements. The cables 14 can be, but are not limited to, single wire cables (e.g., single coaxial cables and single twin-axial cables) and multi-wire cables (e.g., multiple coaxial cables, multiple twin-axial cables, and twisted-pair cables). It is further understood and intended that different types and configurations of cables 14 and cable terminations 18 may be used simultaneously with the connector assembly 10. For example, a portion of the cables 14 and cable terminations 18 retained by the carrier 16 may be coaxial cables and terminations, while another portion of the cables 14 and cable terminations 18 retained by the carrier 16 may be twin-axial cable (or other) cables and terminations.

In addition, the invention is described and illustrated herein as used with a particular style of carrier 16 and header 20. In particular, the figures illustrate a Compact PCI A-style header, and a Compact PCI C-style carrier, where two C-style carriers mate to a single A-style header (although only one carrier is illustrated for clarity). In other embodiments, different numbers and styles of header and carriers may be used without departing from the teachings herein. For example, a single A-style carrier may be substituted for two individual C-style carriers.

Figure 3:
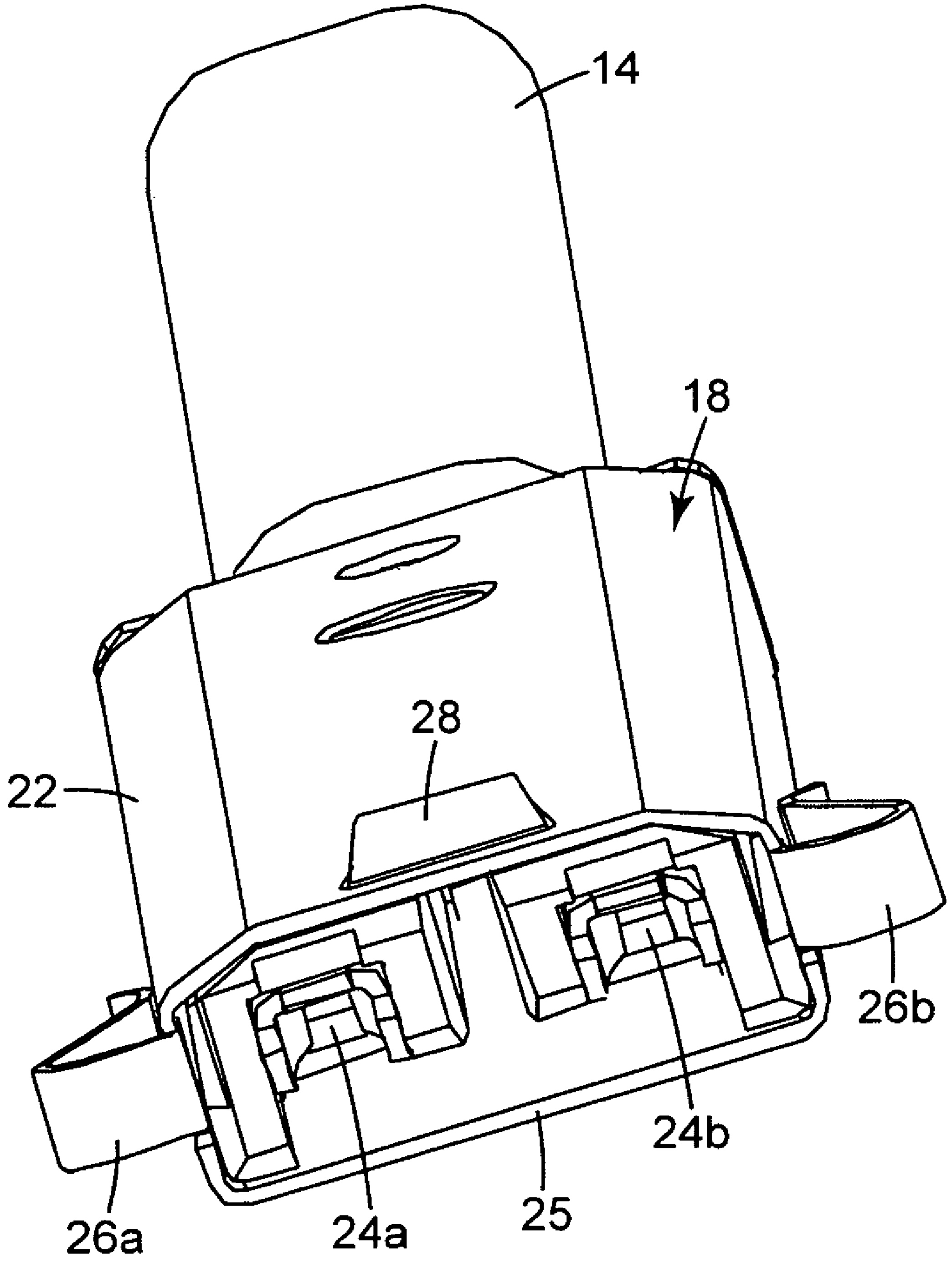
FIG. 3 is a perspective illustration of a cable termination according to one embodiment.

With reference to FIG. 3, cable termination 18 has an electrically conductive housing 22 having mounted therein at least one internal contact 24. The at least one internal contact is accessible through a front edge 25 of cable termination 18. In one embodiment, cable termination 18 comprises two internal contacts 24*a*, 24*b* (collectively referred to herein as internal contacts 24). Internal contacts 24 may be configured for use as signal contacts, ground contacts, or power contacts, as required by the intended application. When configured as a signal contact, internal contact 24 is electrically connected to a corresponding signal conductor of the associated cable 14 and electrically insulated from the conductive housing 22. When configured as a ground contact, internal contact 24 is electrically connected to a corresponding grounding member of the associated cable 14, such as a ground shield, and provides a return path ground for an associated signal. When configured as a power contact, internal contact 24 is electrically connected to a cable 14 communicating with an electrical power source. In one embodiment, the internal contacts 24 of cable termination 18 include at least one signal contact.

The cable termination 18 further includes at least two external contacts 26*a*, 26*b* (collectively "external contacts 26"). In one embodiment according to the invention, at least one of the external contacts 26 extends from an exterior of the conductive housing 22 of cable termination 18. In another embodiment according to the invention, each of the external contacts 26 extends from an exterior of the conductive housing 22 of cable termination 18. External contacts 26 may be configured for use as ground contacts or power contacts, as required by the intended application. When configured as ground contacts, external contacts 26 are electrically connected to a ground conductor (i.e., shield) of the associated cable 14 and/or to the conductive housing 22. When configured as power contacts, external contacts 26 are electrically connected to an electrical power source. In one embodiment, both of external contacts 26 are ground contacts.

In the illustrated embodiment, the external contacts 26 are resilient beams extending from conductive housing 22. In other embodiments, the external contacts 26 can take alternate forms from that illustrated, and may include, for example a hertzian bump extending from conductive housing 22 of the cable termination 18. In one embodiment, external contact 26*a* is different from external contact 26*b* (e.g., external contact 26*a* comprises a cantilever beam and external contact 26*b* comprises a hertzian bump).

The internal contacts 24 and external contacts 26 are positioned such that the internal contacts 24 are positioned between external contacts 26 in a linearly aligned arrangement, and are configured to receive and/or make electrical connection with respective signal and ground pins in the mating connector header 20 when carrier 16 is inserted into header 20.

In one embodiment according to the invention, conductive housing 22 of each cable termination 18 further includes at least one additional external contact 28 extending from an external surface of conductive housing 22, where external contact 28 extends or projects in a direction generally transverse to the linear arrangement of internal contacts 24 and external contacts 26. In the illustrated embodiment, the additional external contact 28 is a resilient beam extending from conductive housing 22. In other embodiments, the external contact 28 can take alternate forms from that illustrated, and may include, for example a hertzian bump extending from conductive housing 22 of the cable termination 18. As will be described in greater detail below, the external contact 28 is configured for making electrical contact with the conductive housing 22 of an adjacent cable termination 18 when positioned in the carrier 16, or when engaged with header 20 if carrier 16 is not used. By using external contact 28 to electrically connect conductive housings 22 of adjacent cable terminations 18, the conductive housings 22 form a common ground matrix around the signal lines of the connector assembly 10. As described above with respect to external contacts 26, external contact 28 may be configured for use as a ground contact or a power contact, as required by the intended application. When configured as a ground contact, external contact 28 is electrically connected to the chassis ("earth") ground of the connector assembly 10.

Figure 2A:
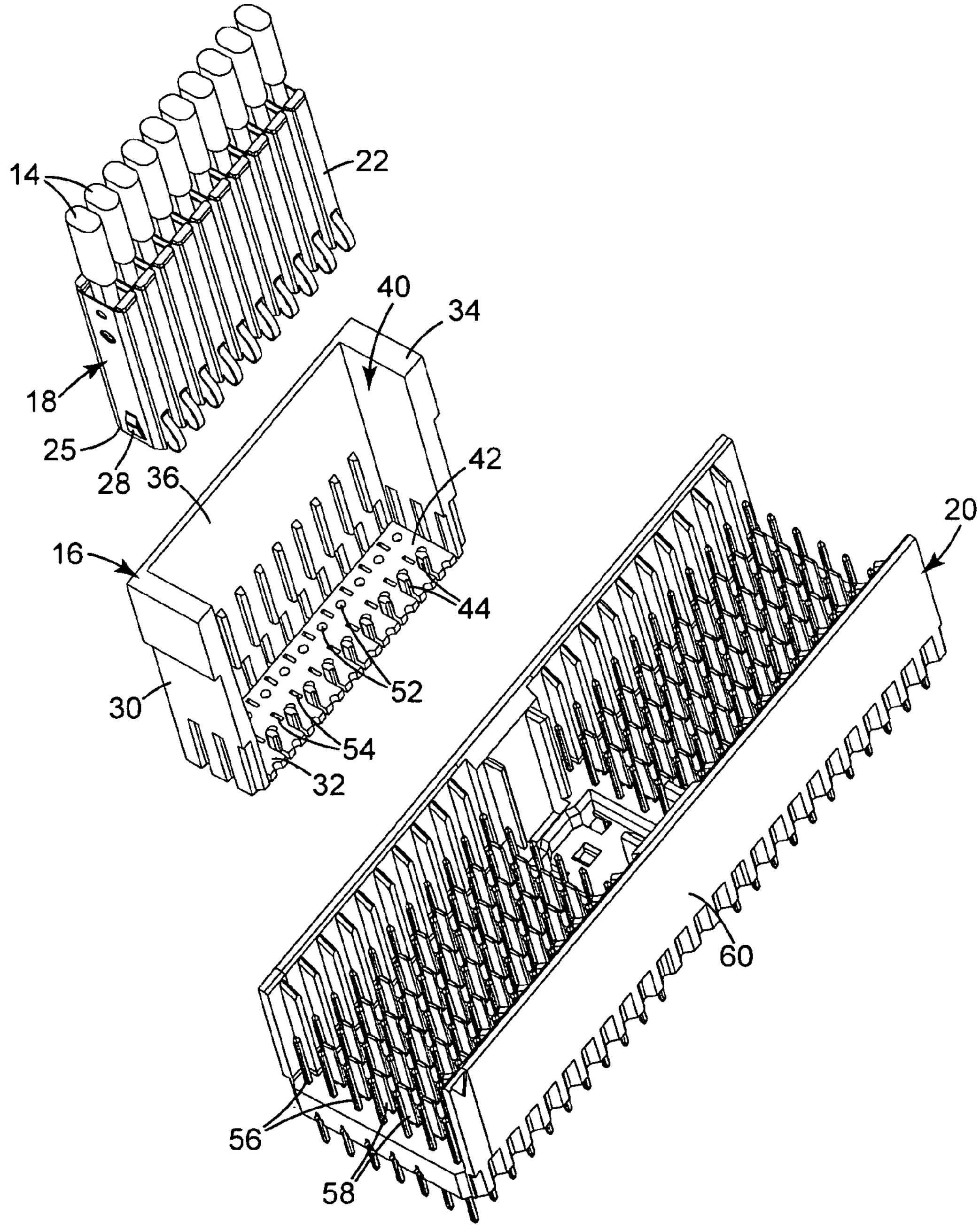
FIG. 2A is a partially exploded perspective illustration of the connector assembly of FIG. 1A, with a portion of the carrier and cable terminations removed for clarity.

Referring to FIGS. 1A and 2A carrier 16 includes an insulative body 30 having a front or mating wall 32, a back edge 34, opposing side walls 36, and opposing lateral walls 38. Front wall 32, side walls 36 and lateral walls 38 define a termination receiving cavity 40. As each cable termination 18 is inserted into cavity 40 of carrier 16, front edge 25 of the cable termination 18 is guided into position by features provided on back side 42 of front wall 32. In the illustrated embodiment, back side 42 of front wall 32 includes upstanding posts 44 configured to guide cable terminations 18 into position within cavity 40 and to maintain front edges 25 of the cable terminations 18 in proper alignment with the back side 42 of front wall 32 (FIG. 2A).

Figure 2B:
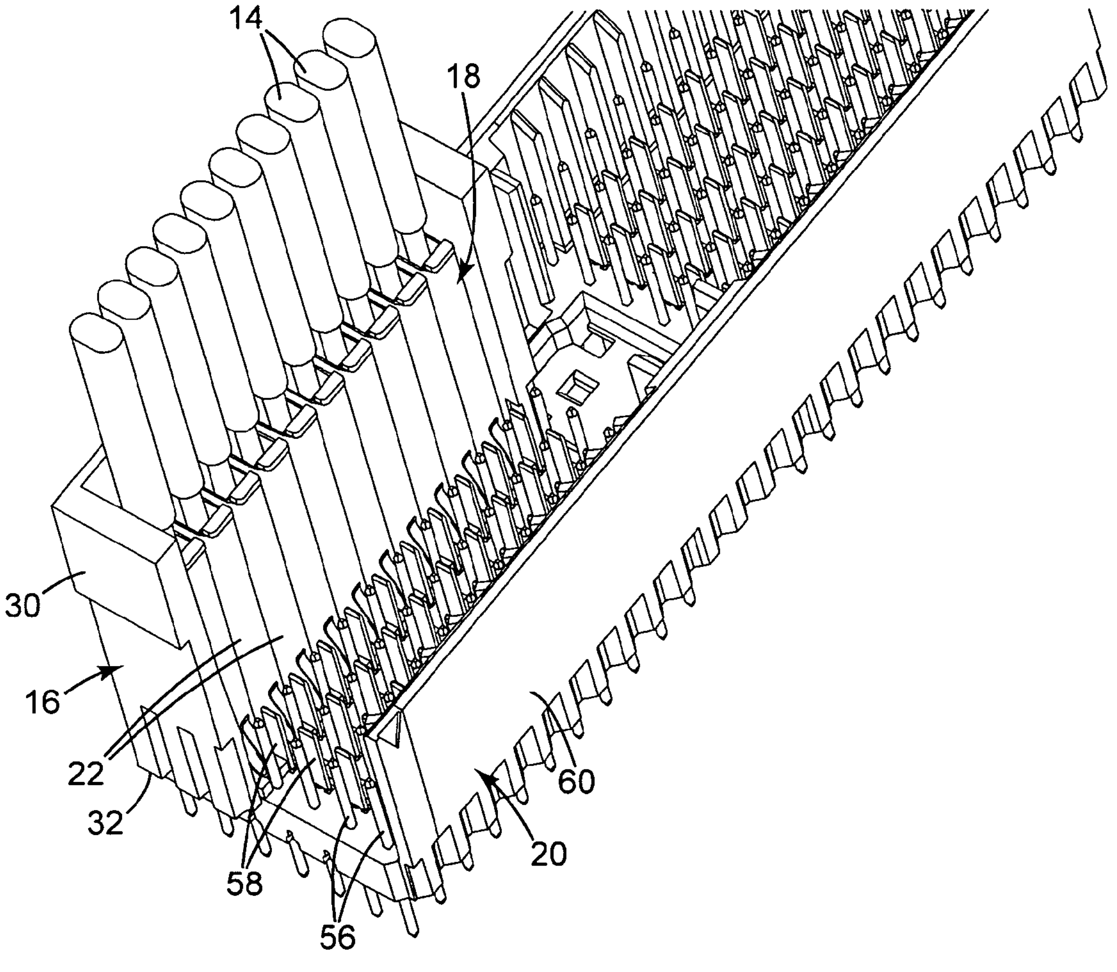
FIG. 2B is a perspective illustration of the connector assembly of FIG. 2A, with the carrier holding the cable terminations engaged with the header.

As best seen in FIGS. 2A and 2B, the front wall 32 of carrier 16 includes a plurality of openings 52, 54 for allowing passage therethrough, respectively, of male contacts 56, 58 of the header 20 (described below). In the exemplary embodiment, male contacts 56 are pin contacts, and male contacts 58 are blade contacts; correspondingly, openings 52 are shaped to receive pin contacts, and openings 54 are shaped to receive blade contacts. Individual ones of male contacts 56, 58 may be configured as signal conductors, ground conductors, or power conductors, depending upon the intended application. Cable terminations 18 are situated within carrier 16 such that the internal contacts 24 and external contacts 26 of each cable termination 18 are positioned adjacent openings 52, 54 to receive or make contact with corresponding ones of male contacts 56, 58.

The cable terminations 18 may be retained within the carrier 16 by any suitable means, including but not limited to snap fit, friction fit, press fit, mechanical clamping and adhesive. Further, the means used to retain the cable terminations 18 within the carrier 16 may permit the cable terminations 18 to be removed, or the means used to retain the cable terminations 18 within the carrier 16 may permanently secure the cable terminations 18 within the carrier 16. The ability to remove and replace individual cable terminations 18 is beneficial when replacing a damaged or defective cable termination 18 or cable 14, for example.

Referring again to FIGS. 1A-2B, and as best seen in FIG. 2B, the header 20 includes an insulative housing 60 containing the male contacts 56, 58 arranged for mating with the internal contacts 24 and external contacts 26 of the cable terminations 18 in the carrier 16. In one embodiment, header 20 is substantially conventional in design. The male contacts 56, 58 of the header 20 are connected to the printed circuit board 12 as is known in the art. As noted above, male contacts 56, 58 may be either signal contacts, ground contacts, or power contacts, and are appropriately configured for electrical connection to one or more of a plurality of signal traces 66 of the printed circuit board 12 (for signal contacts), for electrical connection to at least one ground trace 68 or ground plane of the printed circuit board 12 (for ground contacts), or for electrical connection to at least one power trace 70 or power plane of the printed circuit board 12 (for power contacts). The male contacts 56, 58 configured as ground contacts may be connected to a common circuit board ground trace 68 or ground plane or to isolated grounds as may be desired for a particular application. The male contacts 56, 58 configured as power contacts may be connected to a common circuit board power trace 70 or power plane, or to isolated power sources as may be desired for a particular application.

Figure 4:
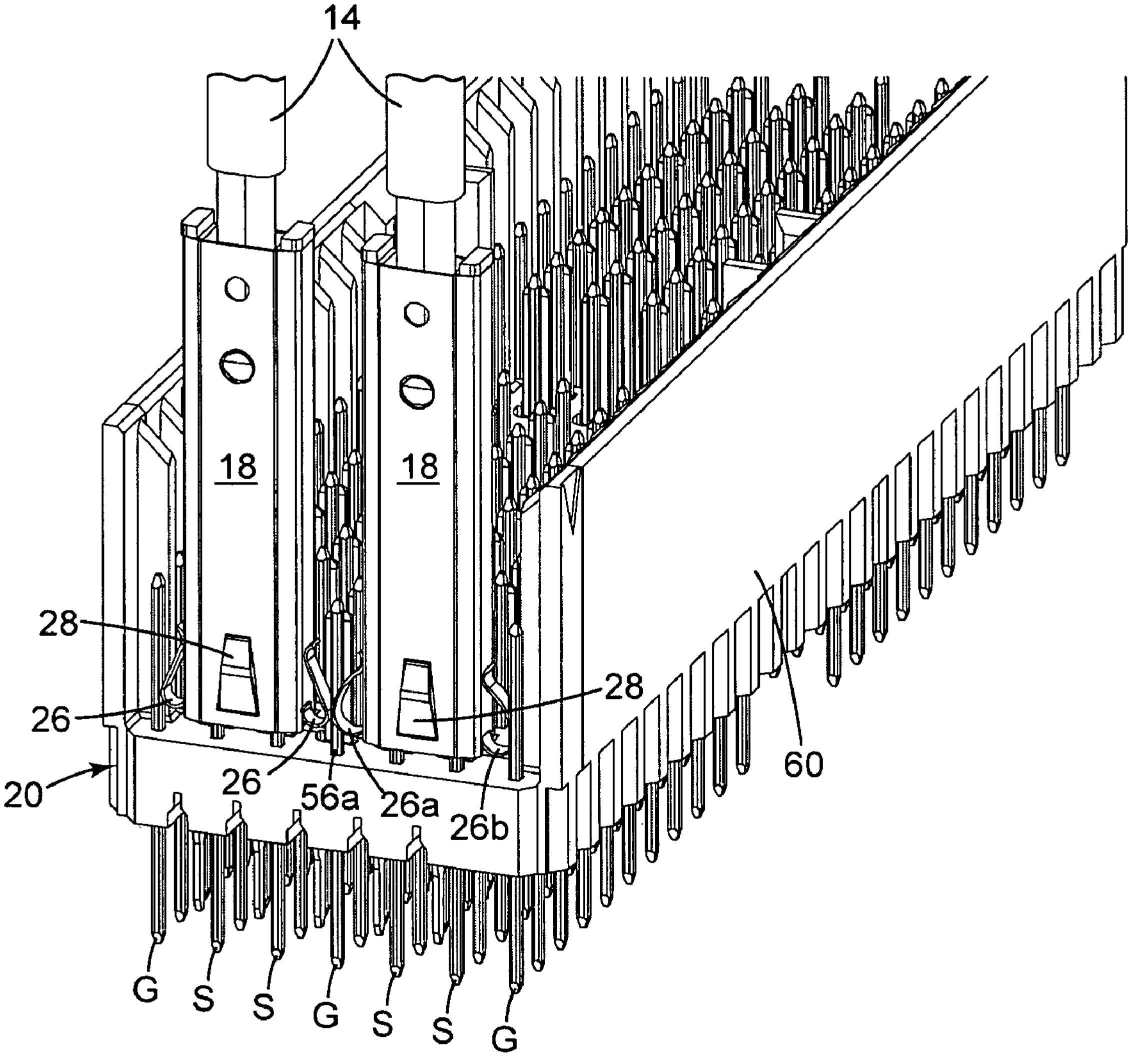
FIG. 4 is a perspective illustration of two exemplary cable terminations engaged with a header, with the carrier removed for clarity.

In one embodiment, male contacts 56 are configured so as to provide two signal contacts positioned between two ground contacts to form a ground-signal-signal-ground (GSSG) configuration. As illustrated in FIG. 4 and FIG. 5A, adjacent pairs of signal contacts may share a common ground contact between the signal pairs to form a repeating ground-signal-signal-ground-signal-signal-ground (GSSGSSG) configuration in each row of pins. In such an arrangement, as shown in FIG. 4, ground pins 56*a* engage an external contact 26 on each of the two adjacent cable terminations 18 (i.e., a single ground pin 56*a* engages two external contacts 26). In one embodiment, the "outer" ground pins (G) of the arrangement may be eliminated, such that external contacts 26 of the two adjacent cable terminations 18 make contact with only the centrally located ground pin 56*a*.

In other embodiments, male contacts 56 are configured to provide different ground and signal arrangements. For example, referring to FIG. 5B, in one implementation male contacts 56 are configured to form an arrangement in which a single signal contact is positioned between two ground contacts, forming a repeating ground-signal-ground-signal-ground-signal-ground (GSGSGSG) configuration within each row of male contacts 56. The same configuration is repeated in each row of male contacts 56, thereby providing a row-differential configuration (e.g., GSGSGSG/GSGSGSG) as illustrated in FIG. 5B. In another implementation, referring to FIG. 5C, male contacts 56 are configured to form an arrangement in which signal and ground contacts alternate in both rows and columns to provide a single-ended configuration (e.g. GSGSGSG/SGSGSGS). It should be noted that embodiments are not limited to any particular number of rows of male contacts 56, 58.

Although the individual electrical cable terminations 18 described herein have what is referred to as a 1×2 configuration (i.e., having two internal contacts 24), it is understood that other embodiments of cable terminations are possible by combining more than one 1×2 termination into a single unit, while retaining the functions described herein with respect to a 1×2 contact. For example, two 1×2 terminations may be combined to form one 1×4 termination, or one 2×2 termination.

Although the header 20 is shown and described herein as a through-hole pin header, the header 20 may also be a surface-mount pin header or any other suitable type of header known in the art. The male contacts 56, 58 of header 20 may be connected to the printed circuit board 12 by soldering, press fit, or any other suitable means. In one embodiment, the header 20 is secured to the printed circuit board 12 only by the connection between the male contacts 56, 58 and the printed circuit board 12. In another embodiment, the header housing 60 includes additional means for securing the header 20 to the printed circuit board 12, as are known in the art. In one embodiment, a pair of headers 20 is positioned on opposite sides of printed circuit board 12, such that the pair of headers share a single set of male contacts 56, 58 that extend completely through printed circuit board 12. All, some, or none of male contacts 56, 58 may make contact with signal, ground and power traces of printed circuit board 12.

In the illustrated embodiment, the header 20 contains a full array of male contacts 56 such that each internal contact 24 and external contact 26 of the cable terminations 18 make electrical connection with a corresponding male contact 56 in the header 20. In another embodiment, less than a full array of male contacts 56 is provided in the header 20, such that not every internal contact 24 and external contact 26 of the cable terminations 18 makes electrical connection with a corresponding male contact 56 of the header 20.

In one embodiment, the header 20 and carrier 16 include latching means (not shown) configured to retain the header 20 and carrier 16 in a mated configuration, as is known in the art. It is understood and intended that a variety of latching means may be provided as is suitable for the intended application.

In one embodiment, the header 20 and carrier 16 further include keying means (not shown) configured to prevent incorrect alignment of header 20 and carrier 16. It is understood and intended that a variety of keying means may be provided as is suitable for the intended application.

In each of the embodiments and implementations described herein, the various components of the connector assembly and elements thereof are formed of any suitable material. The materials are selected depending upon the intended application and may include both polymers and metals. In one embodiment, the insulative body 30 and header housing 60 are formed of polymeric materials by methods such as injection molding, extrusion, casting, machining, and the like, while the electrically conductive components are formed of metal by methods such as molding, casting, stamping, machining, and the like. Material selection will depend upon factors including, but not limited to, chemical exposure conditions, environmental exposure conditions including temperature and humidity conditions, flame-retardancy requirements, material strength, and rigidity, to name a few.

Thus, an economical printed circuit board header-to-cable connector assembly for high speed systems has been demonstrated. The connector assembly uses readily available low cost components and provides excellent performance in high speed systems. Although specific embodiments have been illustrated and described herein for purposes of description of the preferred embodiment, it will be appreciated by those of ordinary skill in the art that a wide variety of alternate or equivalent implementations may be substituted for the specific embodiments shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. An electrical connector assembly for transmitting electrical signals, the assembly comprising:
- a header having a plurality of signal pins and a plurality of ground pins; and
- a plurality of electrical cable terminations, each of the plurality of cable terminations comprising,
- an electrically conductive housing,
- at least one signal contact positioned within an interior of the housing and electrically insulated from the housing, and
- at least two ground contacts extending from an exterior of the housing;
- wherein the cable terminations are configured to mate with the header such that, for each cable termination, the at least one signal contact engages a corresponding one of the plurality of signal pins, and the ground contacts engage corresponding ones of the plurality of ground pins when the header and cable terminations are in a mated configuration, and
- wherein two or more adjacent cable terminations share two or more common grounds.

2. The electrical connector assembly of claim 1, wherein the at least one signal contact and at least two ground contacts are linearly aligned.

3. The electrical connector assembly of claim 1, wherein at least one of the plurality of ground pins engages ground contacts of more than one of the plurality of cable terminations.

4. The electrical connector assembly of claim 3, wherein adjacent rows of the signal and ground pins are arranged to form a GSSGSSG ordering.

5. The electrical connector assembly of claim 1, wherein the pair of signal contacts is accessible through a front edge of the cable termination, and wherein the pair of ground contacts extends from opposite sides of the housing.

6. The electrical connector assembly of claim 1, wherein the cable terminations are configured such that the housings of at least a portion of adjacently positioned cable terminations make electrical contact with each other.

7. The electrical connector assembly of claim 6, further comprising, a third ground contact extending from the housing of at least a portion of the cable terminations, the third ground contact configured to make electrical contact with the housing of an adjacently positioned cable termination.

8. The electrical connector assembly of claim 1, further comprising a carrier, the carrier configured to retain at least a portion of the plurality of cable terminations therein and position the retained cable terminations in mating alignment with the header.

9. The electrical connector assembly of claim 8, wherein the plurality of cable terminations is individually removable from the carrier.

10. An electrical connector assembly for transmitting electrical signals between a printed circuit board and an electrical cable, the assembly comprising:
- the printed circuit board having a plurality of signal traces and at least one ground trace;
- a header body mounted on the printed circuit board, the header body supporting a plurality of signal pins and a plurality of ground pins, wherein the plurality of signal pins are electrically connected to the plurality of signal traces and wherein the plurality of ground pins are electrically connected to the at least one ground trace;
- a carrier body configured to mate with the header body; and
- a plurality of electrical cable terminations retained within the carrier body, each of the plurality of cable terminations including a pair of signal contacts positioned within an interior of an electrically conductive housing and at least two ground contacts, wherein at least one of the ground contacts extends from an exterior of the housing;
- wherein the header body and cable terminations are configured such that each of the plurality of cable terminations makes electrical contact with a pair of the signal pins and a pair of the ground pins when the header and carrier bodies are in a mated configuration, the pair of signal pins positioned between the pair of ground pins, and
- wherein when the housing is a shield box and mated to a header it is grounded on more than two sides.

11. The electrical connector assembly of claim 10, wherein at least one of the plurality of ground pins engages ground contacts of more than one of the plurality of cable terminations.

12. An electrical connector assembly for transmitting electrical signals, the assembly comprising:

a header having a plurality of rows of male contacts, each row of the male contacts comprising one or more of a signal pin, a ground pin, and a power pin; and a plurality of electrical cable terminations, each of the plurality of cable terminations comprising, an electrically conductive housing, at least one internal contact positioned within an interior of the housing and electrically insulated from the housing, the internal contact comprising one of a signal contact, a ground contact, and a power contact, and at least two external contacts extending from an exterior of the housing, each of the external contacts comprising one of a ground contact and a power contact wherein the at least one internal contact and at least two external contacts are linearly aligned;

wherein the cable terminations are configured to mate with the header such that, for each cable termination, the at least one internal contact and the ground contacts engage corresponding ones of the plurality of male contacts when the header and cable terminations are in a mated configuration, and wherein two or more adjacent cable terminations share two or more common grounds.

13. The electrical connector assembly of claim 12, wherein at least one of the plurality of male contacts engages external contacts of more than one of the plurality of cable terminations.

14. The electrical connector assembly of claim 12, wherein the at least one internal contact comprises two internal contacts, the two internal contacts electrically insulated from each other and the housing.

15. The electrical connector assembly of claim 12, wherein the external contacts each comprise one of a resilient beam extending from the housing and a hertzian bump extending from the housing.

16. The electrical connector assembly of claim 12, wherein the housings of at least a portion of adjacently positioned cable terminations make electrical contact with each other.

17. The electrical connector assembly of claim 16, further comprising a third external contact extending from the housing of at least a portion of the cable terminations, the third external contact configured to make electrical contact with the housing of an adjacently positioned cable termination.

18. The electrical connector assembly of claim 17, wherein the third external contact extends from the housing in a direction transverse to the linear alignment of the at least one internal contact and at least two external contacts.

19. The electrical connector assembly of claim 12, further comprising a carrier, the carrier configured to retain at least a portion of the plurality of cable terminations therein and position the retained cable terminations in mating alignment with the header.

20. The electrical connector assembly of claim 12, further comprising:

a printed circuit board having a plurality of signal lines and at least one ground line;

wherein the header is mounted on the printed circuit board to electrically connect each male contact to at least one of the signal lines and the at least one ground line of the printed circuit board.

* * * * *

UNITED STATES PATENT AND TRADEMARK OFFICE
CERTIFICATE OF CORRECTION

PATENT NO. : 7,744,385 B2
APPLICATION NO. : 12/247146
DATED : June 29, 2010
INVENTOR(S) : Richard J. Scherer It is certified that error appears in the above-identified patent and that said Letters Patent is hereby corrected as shown below:

Column 8,
Line 20, in Claim 7, delete "comprising," and insert --comprising--, therefor.

Column 9,
Line 13, in Claim 12, delete "contact" and insert --contact,--, therefor.

Signed and Sealed this
Eighth Day of March, 2011

David J. Kappos
*Director of the United States Patent and Trademark Office*